(12) United States Patent
Nakada et al.

(10) Patent No.: US 9,460,945 B2
(45) Date of Patent: Oct. 4, 2016

(54) SUBSTRATE PROCESSING APPARATUS FOR SEMICONDUCTOR DEVICES

(75) Inventors: Shigeo Nakada, Toyama (JP); Takayuki Nakada, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 1027 days.

(21) Appl. No.: 11/976,949

(22) Filed: Oct. 30, 2007

(65) Prior Publication Data

US 2008/0105204 A1     May 8, 2008

(30) Foreign Application Priority Data

Nov. 6, 2006  (JP) ................................. 2006-300966
Oct. 22, 2007  (JP) ................................. 2007-273530

(51) Int. Cl.
| | |
|---|---|
| *C23C 16/00* | (2006.01) |
| *H01L 21/00* | (2006.01) |
| *H01L 21/67* | (2006.01) |
| *H01L 21/677* | (2006.01) |

(52) U.S. Cl.
CPC ... *H01L 21/67109* (2013.01); *H01L 21/67757* (2013.01)

(58) Field of Classification Search
CPC .................. H01L 21/02228; H01L 21/67757; C23C 16/45546; C23C 16/45548
USPC .......................................................... 118/719
See application file for complete search history.

(56) References Cited

U.S. PATENT DOCUMENTS

| | | | | |
|---|---|---|---|---|
| 5,226,812 A | * | 7/1993 | Sakata ........................... | 432/241 |
| 5,303,671 A | * | 4/1994 | Kondo et al. ................. | 118/719 |
| 5,510,146 A | * | 4/1996 | Miyasaka ...................... | 438/151 |

(Continued)

FOREIGN PATENT DOCUMENTS

| | | |
|---|---|---|
| JP | 07-161656 | 6/1995 |
| JP | 10-022266 | 1/1998 |

(Continued)

OTHER PUBLICATIONS

Notice of Reasons for Rejection issued by the Japanese Patent Office in counterpart application No. 2007-273530 mailed Aug. 21, 2012 with English translation (9 pages).

*Primary Examiner* — Parviz Hassanzadeh
*Assistant Examiner* — Nathan K Ford
(74) *Attorney, Agent, or Firm* — Kratz, Quintos & Hanson, LLP (57) ABSTRACT

A substrate processing apparatus comprises a processing chamber for processing a substrate, a substrate supporting tool for supporting and carrying the substrate into the processing chamber, a standby chamber formed below the processing chamber for holding the substrate supporting tool in standby, a gas supply unit provided on the side of the standby chamber for supplying inert gas or gas containing oxygen into the standby chamber, a gas exhaust unit provided on the side of the standby chamber and opposite to the gas supply unit, for exhausting the inert gas or gas containing oxygen from the standby chamber, a first gas exhaust path connected to the gas exhaust unit for exhausting the inert gas or gas containing oxygen within the gas exhaust unit, a second gas exhaust path connected to the side of the gas exhaust unit for exhausting the gas containing oxygen within the exhaust gas unit, and a gate valve for opening and closing the second gas exhaust path.

9 Claims, 8 Drawing Sheets

(56) References Cited

U.S. PATENT DOCUMENTS 5,810,538 A * 9/1998 Ozawa et al. ................ 414/217
2002/0197145 A1 * 12/2002 Yamamoto et al. .......... 414/806

FOREIGN PATENT DOCUMENTS

| JP | 2000-306842 | 11/2000 |
| JP | 2004-119888 | 4/2004 |

* cited by examiner

SUBSTRATE PROCESSING APPARATUS FOR SEMICONDUCTOR DEVICES

BACKGROUND OF INVENTION

1. Field of Invention

The present invention relates to a substrate processing apparatus and a semiconductor device manufacturing method, and relates in particular to technology for preventing or inhibiting the forming of a natural oxidation film.

The present invention for example is effective for use in heat treatment apparatus (furnaces) for heat treatment of semiconductor wafers (hereinafter called "wafers") on which semiconductor integrated circuits including semiconductor elements are formed in a method for manufacturing semiconductor integrated circuit devices (hereinafter called "IC").

2. Description of Related Art

Heat treatment apparatus are widely used in heat treatment processes in IC manufacturing methods for forming a CVD film such as an insulating film, or metallic film or semiconductor film on the wafer and diffusing dopants.

In the prior art, this type of heat treatment apparatus includes a processing chamber for batch processing of multiple wafers held in a boat, a standby chamber for holding the boat in standby before loading and after unloading into/from the processing chamber, a cleaning unit made up of a blower and a filter for supplying a clean atmosphere into the standby chamber, and a boat elevator installed opposite the filter in the standby chamber to raise and lower the boat between the standby chamber and the processing chamber.

A motor serving as the drive device for the boat elevator is usually installed in a motor mount chamber isolated from the standby chamber.

This heat treatment apparatus of the prior art is constructed to blow and circulate nitrogen gas serving as the inert gas from the cleaning unit to the standby chamber and in this way prevents oxygen ($O_2$) in the atmosphere from forming a natural oxidation film on the wafer. This technology is disclosed for example in the patent document 1.

Patent document 1 Japanese Patent Non-Examined Publication No. 2004-119888

In this type of heat treatment apparatus, preventing a natural oxidation film from being formed on the wafer due to oxygen in the atmosphere by blowing and circulating nitrogen gas from the cleaning unit to the standby chamber requires maintaining the oxygen concentration within the standby chamber within a few ppm.

This heat treatment apparatus prevents an inflow of the atmosphere into the standby chamber by maintaining the nitrogen gas within the standby chamber at a positive pressure. In other words, besides setting the case forming the standby chamber to render a high sealing effect, nitrogen gas is supplied into the standby chamber at a higher flow rate than the rate at which nitrogen gas leaks out from gaps in the case.

Therefore, in heat treatment apparatus where a heat treating process is assumed to take place in a nitrogen gas atmosphere, the exhaust duct for exhausting the interior of the standby chamber does not need to be made very large.

In other words, the heat treatment apparatus need only maintain the relation in the following equations.

Quantity of atmospheric flow into standby chamber=added supply quantity of nitrogen gas+(circulating atmosphere in standby chamber)

Quantity of exhaust atmospheric flow from standby chamber=Quantity of leak or the like from standby chamber+(circulating atmosphere in standby chamber)

Quantity of atmospheric flow into standby chamber-≥Quantity of exhaust atmospheric flow from standby chamber On other hand, if there is no need to inhibit formation of a natural oxidation film (for example, when a natural oxidation film does not occur on the type of film in the heat treatment process), then creating a non-circulating air flow (air containing oxygen, hereinafter sometimes called "clean air") in one direction within the standby chamber is preferable in terms of thermal effects.

This one-way flow can be set by satisfying the following simple equation.

Quantity of atmospheric flow into standby chamber=Quantity of exhaust atmospheric flow from standby chamber In this case, blowing the clean air from one side of the standby chamber towards the other side so that the flow is horizontal to the boat, is preferable in preventing phenomena that particles and organic matter stagnate or accumulate inside the standby chamber.

In other words, the exhaust duct for exhausting the interior of the standby chamber must be a sufficiently large size in order to ensure a clean atmosphere within the standby chamber.

The same heat treatment apparatus must be capable of meeting both of the above needs.

Currently however, exhaust performance is inadequate in cases where the case is highly sealed assuming circulation of the atmosphere within the standby chamber.

Designing the heat treatment apparatus with a large exhaust duct to achieve satisfactory exhaustion leads to the problem of a bad footprint (projected floor area) of the heat treatment apparatus.

SUMMARY OF INVENTION

The present invention therefore has an object of providing a substrate processing apparatus and a semiconductor device manufacturing method capable of achieving both a one-way flow and circulation of the atmosphere in the standby chamber.

The aspect of the invention for resolving the aforementioned issues is as follows.

A substrate processing apparatus comprising:

a processing chamber for processing a substrate;

a substrate supporting tool for supporting and carrying the substrate into the processing chamber;

a standby chamber formed below the processing chamber for holding the substrate supporting tool in standby;

a gas supply unit provided on the side of the standby chamber for supplying inert gas or gas containing oxygen into the standby chamber;

a gas exhaust unit provided on the side of the standby chamber and opposite to the gas supply unit, for exhausting the inert gas or gas containing oxygen from the standby chamber;

a first gas exhaust path connected to the gas exhaust unit for exhausting the inert gas or gas containing oxygen within the gas exhaust unit;

a second gas exhaust path connected to the side of the gas exhaust unit for exhausting the gas containing oxygen within the exhaust gas unit; and a gate valve for opening and closing the second gas exhaust path.

The above described aspect is capable of circulating inert gas within the standby chamber by supplying inert gas from the gas supply unit to the standby chamber, exhausting the inert gas within the standby chamber from the gas exhaust unit provided on the side of the standby chamber and opposite to the gas supply unit, and exhausting the inert gas within the first gas exhaust unit from the first gas exhaust path connected to the gas exhaust unit.

On the other hand, a one-way flow of gas containing oxygen can be formed in the standby chamber by supplying gas containing oxygen from the gas supply unit to the standby chamber, exhausting gas containing oxygen inside the standby chamber from the gas exhaust unit provided on the side of the standby chamber and opposite to the gas supply unit, and opening the second gas exhaust path connected on the side of the gas exhaust unit by the gate valve, to exhaust gas containing oxygen within the gas exhaust unit via the second gas exhaust path connected to the side of the gas exhaust unit.

DETAILED DESCRIPTION OF PREFERRED EMBODIMENTS

An embodiment of the present invention is described next while referring to the drawings.

A substrate processing apparatus of the present invention is in this embodiment a heat treatment apparatus 10 shown in FIG. 1 through FIG. 4.

An open cassette and a FOUP (front opening unified pod. Hereafter called "pod") are utilized as a carrier (transfer tool) for containing and transfer wafers serving as substrates. The open cassette is formed in approximately a cubic parallelpiped box shape with a pair of open sides facing each other. The pod is formed in approximately a cubic parallelpiped box shape, and fitted with detachable cap on the open side.

When utilizing a pod as the wafer carrier, the wafer cleanliness can be maintained even if particles are present in the atmosphere. The wafers can be transferred in a sealed state.

This embodiment therefore utilizes a pod 2 as the carrier for wafers 1.

A heat treatment apparatus 10 of this embodiment contains a case 11. The case 11 is constructed with an airtight structure to maintain sealing matching the atmospheric pressure. The case 11 constitutes a standby chamber 12 for placing the substrate supporting tool in standby before entering the processing chamber.

The case 11 is constructed of a combination of frames and panels. The panels overlap on each other or interleave with each other and therefore might possibly form tiny gaps that serve as leakage sources.

An installation plate 13 is clamped on the front wall of the case 11. The contact surface between the case 11 and the installation plate 13 might form tiny gaps serving as sources for leakage.

A pair of ports (hereinafter called "wafer loading port") 14 for loading and unloading the wafers 1 are formed at the upper side and lower side of the installation plate 13. A pod opener 15 for opening and closing the pod 2 by removing and fitting a cap 3 (See FIG. 1) for the pod 2 is installed at a position matching the wafer loading ports 14, 14.

A maintenance opening 16 is formed in the rear wall of the case 11. A maintenance door 17 that opens and closes is installed on the maintenance opening 16. The contact surface between the maintenance door 17 and the rear surface of the case 11 at the edges around the opening of the maintenance opening 16 might possibly form tiny gaps serving as leakage sources.

An elevator 18 is installed in the space on the front side of the standby chamber 12. The elevator 18 raises and lowers a wafer transfer equipment 18A. The elevator 18 (Hereafter, sometimes called "the wafer transfer equipment elevator") raises and lowers the wafer transfer equipment 18A. The wafers 1 are carried between the wafer loading port 14 and a boat 21. In this operation, the wafer transfer equipment 18A delivers the wafers 1 to the pod 2 and the boat 21.

A boat elevator 19 is installed perpendicularly in the space on the rear side of the standby chamber 12. The boat elevator 19 raises and lowers a seal cap 20 vertically.

The seal cap 20 is formed in a circular disk shape. The boat 21 serving as the substrate supporting tool is installed on the seal cap 20 vertically along the center line of the seal cap 20.

The boat 21 holds the multiple wafers 1 horizontally while arrayed along the center.

A heater unit 22 is installed concentrically on the upper side of the rear edge of the case 11. The case 11 supports the heater unit 22.

An outer tube 23 and an inner tube 24 are installed concentrically inside the heater unit 22. The outer tube 23 is formed from heat-resistant material such as quartz or silicon carbide. The outer tube 23 is formed in a tubular shape closed at the top end and open at the bottom end, and with an inner diameter larger than the outer diameter of the inner tube 24.

The inner tube 24 is formed from heat-resistant material such as quartz or silicon carbide. The inner tube 24 is formed in a tubular shape open on the top end and the bottom end.

A processing chamber 25 capable of containing the boat 21 is formed in the tubular cavity of the inner tube 24.

A manifold 26 is installed concentrically with the outer tube 23 below the outer tube 23. The manifold 26 is formed from material such as stainless steel, and formed in a tubular shape with the upper end and the lower end open. The manifold 26 engages with the outer tube 23 and the inner tube 24 to support them structurally.

A shutter 27 opens and closes the opening (furnace port) on the bottom end of the manifold 26.

An exhaust pipe 28 is connected to the side wall of the manifold 26 to connect with a space between the outer tube 23 and the inner tube 24. The exhaust pipe 28 exhausts the processing chamber 25.

A gas supply pipe 29 serving as a gas feed unit in the seal cap 20, connects to the interior of the processing chamber 25.

A circulator duct 32 forming a circulating path 31 for circulating nitrogen gas 30 as the inert gas, is installed in the standby chamber 12 in the case 11 as shown in FIG. 1 through FIG. 4.

The circulator duct 32 contains an intake duct 34 including an intake port 33. This intake duct 34 makes up a gas exhaust unit for exhausting the nitrogen gas 30 or clean air (gas containing oxygen) 40. The intake port 33 on the intake duct 34 is formed within the vertical movement range of the arm 19d of the boat elevator 19 and the arm of the wafer transfer equipment elevator 18.

The intake duct 34 serving as the gas exhaust unit from the standby chamber 12 is installed on the right side on one side on the standby chamber 12. The intake duct 34 isolates the boat elevator 19 and the wafer transfer equipment elevator 18 from the transfer chamber (However, the sections where both arms are movable are connected). The intake duct 34 extends perpendicularly across the entire surface.

An intake side end of a main connecting duct 35 connects to the front end on the bottom side of the intake duct 34. The main connecting duct 35 is installed horizontally so as to extend below the pod opener 15 on the outside of the standby chamber 12. A large oblong intake port 36 is formed on the side wall of the main connecting duct 35 facing the standby chamber 12.

An intake side end of a sub connecting duct 37 connects to the approximate center position on the lower end of the intake duct 34. The sub connecting duct 37 is installed to extend left and right along the bottom side within the standby chamber 12.

The lower ends of a blow side duct 39 connect respectively to each blow side end of the sub connecting duct 37 and the main connecting duct 35. A blow port 38 is formed across approximately the entire surface in the blow side duct 39. The blow side duct 39 is installed perpendicular to the left side surface which is the side opposite the intake duct 34 in the standby chamber 12.

A cleaning unit 41 is installed at the blow port 38 of the blow side duct 39. This cleaning unit 41 is the gas supply unit functioning as the gas supply means for supplying the nitrogen gas 30 and the clean air 40.

The cleaning unit 41 includes a filter 42 for trapping particles, and multiple blowers 43 for blowing the clean air 40 and the purified nitrogen gas 30. The filter 42 in the cleaning unit 41 is exposed to the standby chamber 12, and is structured to form the lower flow side for the blower 43 group.

Figure 2:
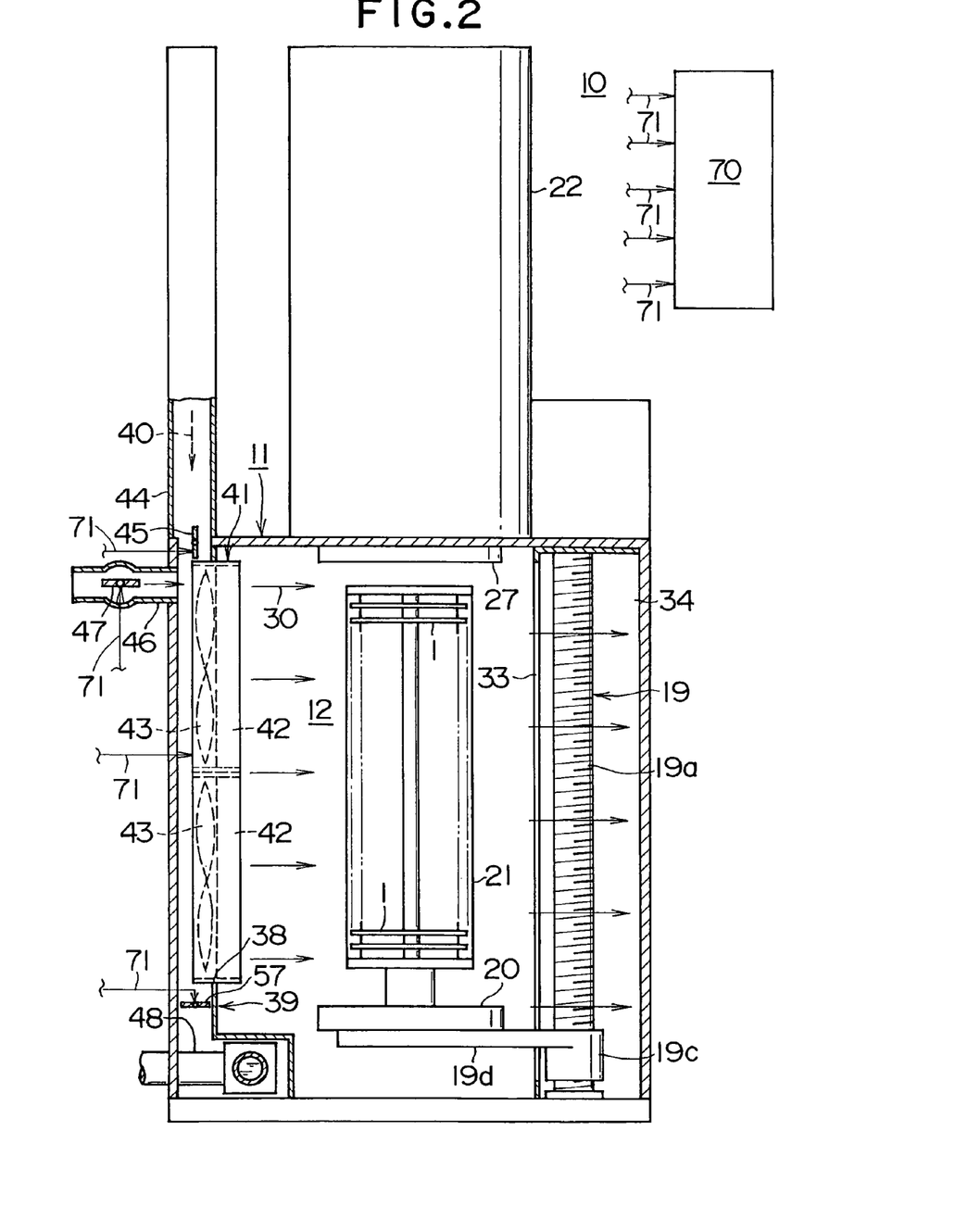
FIG. 2 is a partially cross sectional front view.

As shown in FIG. 2, a fresh air supply pipe 44 for supplying fresh air is connected to the upper flow side than the cleaning unit 41 of the blow side duct 39. A damper 45 is installed on the fresh air supply pipe 44 as an opening/closing valve.

A nitrogen gas supply pipe 46 is connected to the blow side duct 39. The nitrogen gas supply pipe 46 constitutes an inert gas supply path for supplying inert gas to the circulating path 31. A damper 47 is installed on the nitrogen gas supply pipe 46 as a flow rate regulator valve.

Also as shown in FIG. 2, a cooler 48 extending to the front and rear is installed at the bottom end of the blow side duct 39. This cooler 48 cools the atmosphere (nitrogen gas 30) recovered in the blow side duct 39 from the main connecting duct 35 and the sub connecting duct 37.

In the present embodiment, the cooler 48 is made up of a water-cooled type heat exchanger device.

A damper 57 is installed on the lower flow side of the cooler 48 as a flow rate regulator valve. The damper 57 opens and closes the circulating path 31 for making the circulating flow from the main connecting duct 35 and the sub connecting duct 37 to the upper flow side of the cleaning unit 41 of the blow side duct 39.

Figure 3:
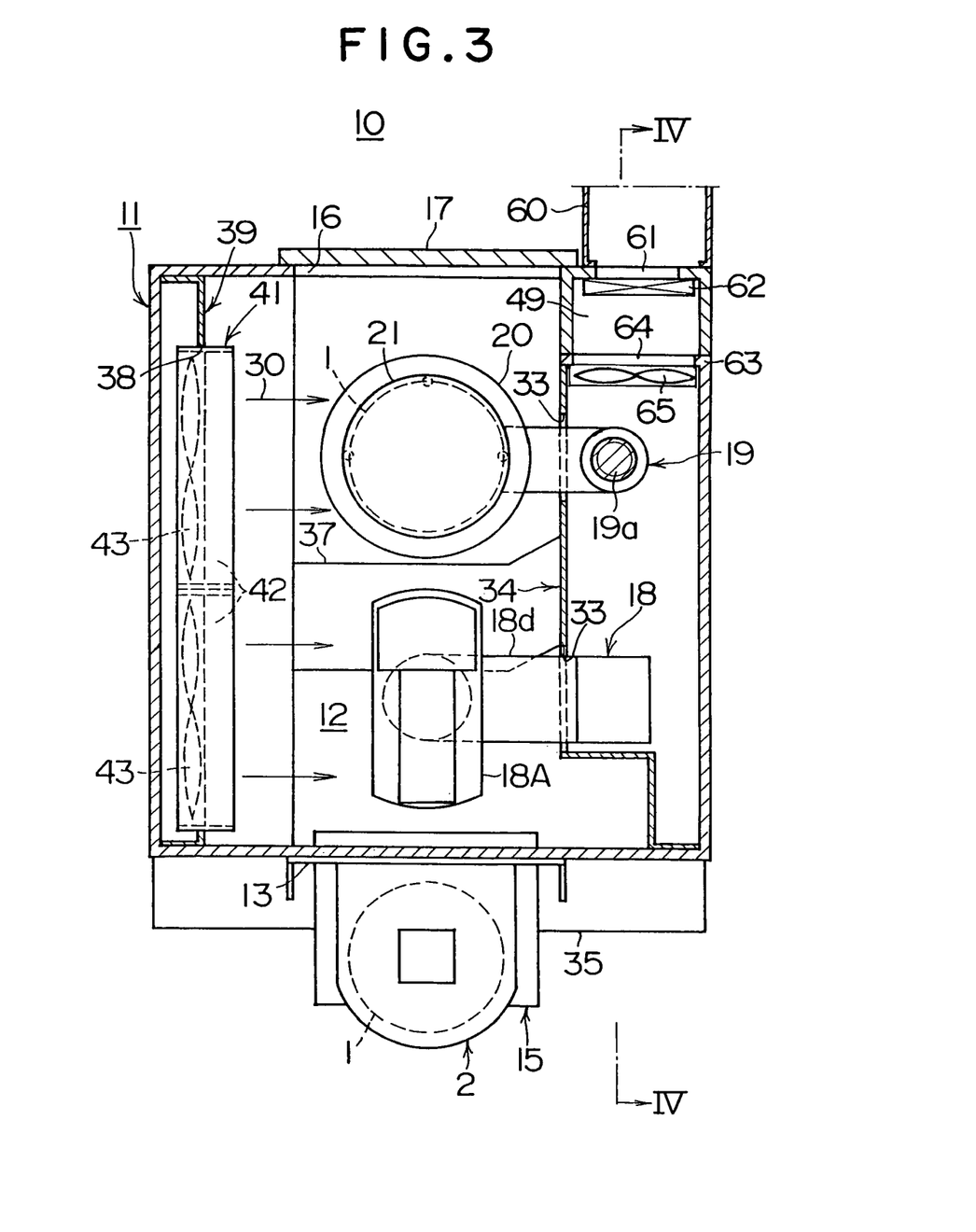
FIG. 3 is a plan cross sectional view showing the standby chamber.
Figure 4:
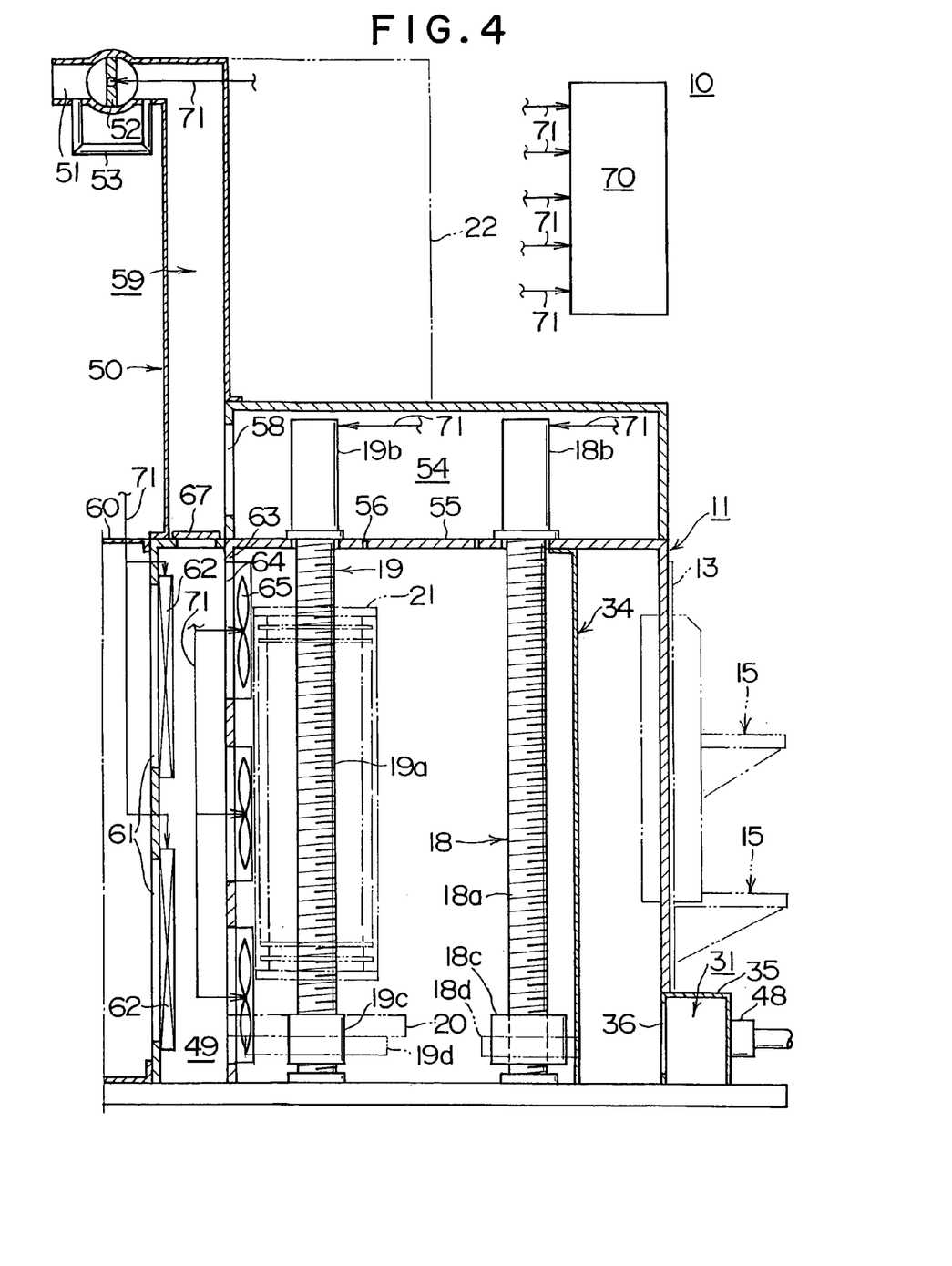
FIG. 4 is a side cross sectional view taken along lines IV-IV in FIG. 3.

As shown in FIG. 3 and FIG. 4, the rear side section of the intake duct 34 forms an exhaust path (second gas exhaust path) 49 connected to the side of the gas exhaust unit.

As shown in FIG. 4, an exhaust duct 50 is connected to the upper end of the exhaust path 49. A main exhaust path 51 is formed on the lower flow side end of the exhaust duct 50.

Another duct is connected to the lower flow end of the exhaust duct 50. This duct does not exhaust the gas in the periphery of the heat treatment apparatus 10 to the clean room, but instead exhausts the entire gas into the exhaust processing system of the plant, etc.

A damper 52 is installed on the main exhaust path 51 as an opening/closing valve.

A bypass 53 is connected to the main exhaust path 51 to bypass the damper 52. The flow rate of the bypass 53 is set to be a smaller flow rate than the main exhaust path 51.

The flow rate of the bypass 53 can be adjusted by installing a flow rate adjuster device such as a flow meter or a needle valve on the bypass 53.

As shown in FIG. 2 through FIG. 4, the boat elevator 19 contains a feed screw 19a erected vertically and supported for free rotation, and a motor 19b for rotating the feed screw 19a forward or reverse, and a rising/lowering block 19c for rising or lowering along with the forward or reverse rotation from engaging with the feed screw 19a, and an arm 19d where the boat 21 is mounted on the tip by way of the seal cap 20 and supported on the rising/lowering block 19c.

As shown in FIG. 3 and FIG. 4, the wafer transfer equipment elevator 18 contains a feed screw 18a erected vertically and supported for free rotation, and a motor 18b for rotating the feed screw 18a forward or reverse, and a rising/lowering block 18c for rising or lowering along with the forward or reverse rotation from engaging with the feed screw 18a, and an arm 18d where the wafer transfer device 18A is installed and supported on the rising/lowering block 18c.

As shown in FIG. 4, a motor mount chamber 54 is provided directly above the intake duct 34. The motor 19b for the boat elevator 19, and the motor 18b for the wafer transfer equipment elevator 18 are mounted in the motor mount chamber 54. The motor mount chamber 54 is constructed as a rectangular parallelpiped box shape with a volume sufficiently larger than the volume of the motor 19b and the motor 18b.

Connecting ports 56 are formed on a partition 55 separating the motor mount chamber 54 and the standby chamber 12. The connecting port 56 connects the interior of the intake duct 34 with the interior of the motor mount chamber 54.

An exhaust port 58 is formed on the section connecting the exhaust duct 50 and the motor mount chamber 54.

The motor mount chamber 54, the connecting port 56, the exhaust port 58 and the exhaust duct 50 make up a first gas exhaust path 59 connected to the upper side of the gas exhaust unit.

As shown in FIG. 3 and FIG. 4, a utility box 60 where gas pipes are installed, connects to the section adjoining the exhaust path 49 on the rear side of the case 11.

The utility box 60 contains a gas supply unit and an exhaust system, etc. The gas supply unit includes a flow meter and a valve for supplying gas to the gas supply pipe 29. The exhaust system contains a pressure gauge and a valve for exhausting the gas from the exhaust pipe.

The wafers are not placed inside the utility box 60, so that there is no need for high cleanliness compared to the degree of cleanliness within the standby chamber 12 which contains an atmosphere where the wafers are placed. The utility box 60 is therefore constructed with much less sealing integrity than the case 11.

Multiple exhaust ports 61 (in the case of this embodiment, two ports) for exhausting the clean air 40 within the exhaust path 49, are formed arranged upward and downward on a partition between the exhaust path 49 and the utility box 60. Gate valves 62 serving as the opening/closing means, respectively open and close each of the exhaust ports 61.

Multiple exhaust ports 64 (in the case of this embodiment, three ports) for exhausting the clean air 40 within the intake duct 34 to the exhaust path 49, are formed arranged upward and downward on a partition 63 between the exhaust path 49 and the exhaust duct 34. Exhaust fans 65 are installed respectively on each exhaust port 64. These exhaust fans 65 are constructed as forced gas exhaust units functioning as the forced gas exhausting means for exhausting the clean air 40 to the exhaust path 49.

The opening areas of the exhaust port 61 and the exhaust port 64 are respectively formed to be larger than the connecting port 56.

In other words, the flow path area of the second gas exhaust path is formed as a large area compared to the first gas exhaust path.

A partition plate 67 divides the section connecting the exhaust path 49 and the exhaust duct 50. This partition plate 67 isolates the first gas exhaust path 59 and the second gas exhaust path 49.

Instead of installing the partition plate 67, the exhaust duct 50 may be mounted on the exhaust path 49, separating the exhaust path 49 and the exhaust duct 50.

As shown in FIG. 4, the heat treatment apparatus 10 contains a controller 70 as a control means to regulate the gate valve 62 and the exhaust fan 65. The controller 70 regulates the exhaust fan 65 and the gate valve 62 via a communication cable 71.

In other words, when supplying the nitrogen gas 30 from the cleaning unit 41 to the standby chamber 12, the controller 70 exerts control so that the gate valve 62 closes the exhaust port 61. Also, when supplying the clean air 40 from the cleaning unit 41 to the standby chamber 12, the controller 70 exerts control so that the gate valve 62 opens the exhaust port 61, or along with operating the exhaust fan 65, controls the gate valve 62 to open the exhaust port 61.

Besides the exhaust fan 65 and the gate valve 62, the controller 70 also regulates conveyor units such as the wafer transfer equipment elevator 18, the boat elevator 19, the wafer transfer equipment 18A, and the pod opener 15; regulates heater units such as the heater unit 22; regulates the blower 43, the dampers 45, 47, 52, 57, and regulates the gas supply, exhaust, and pressure in the processing chamber 25. In other words, the controller 70 the entire heat treatment apparatus 10 by way of the communication cable 71.

The function of the heat treatment apparatus structured as above is described next.

Figure 1:
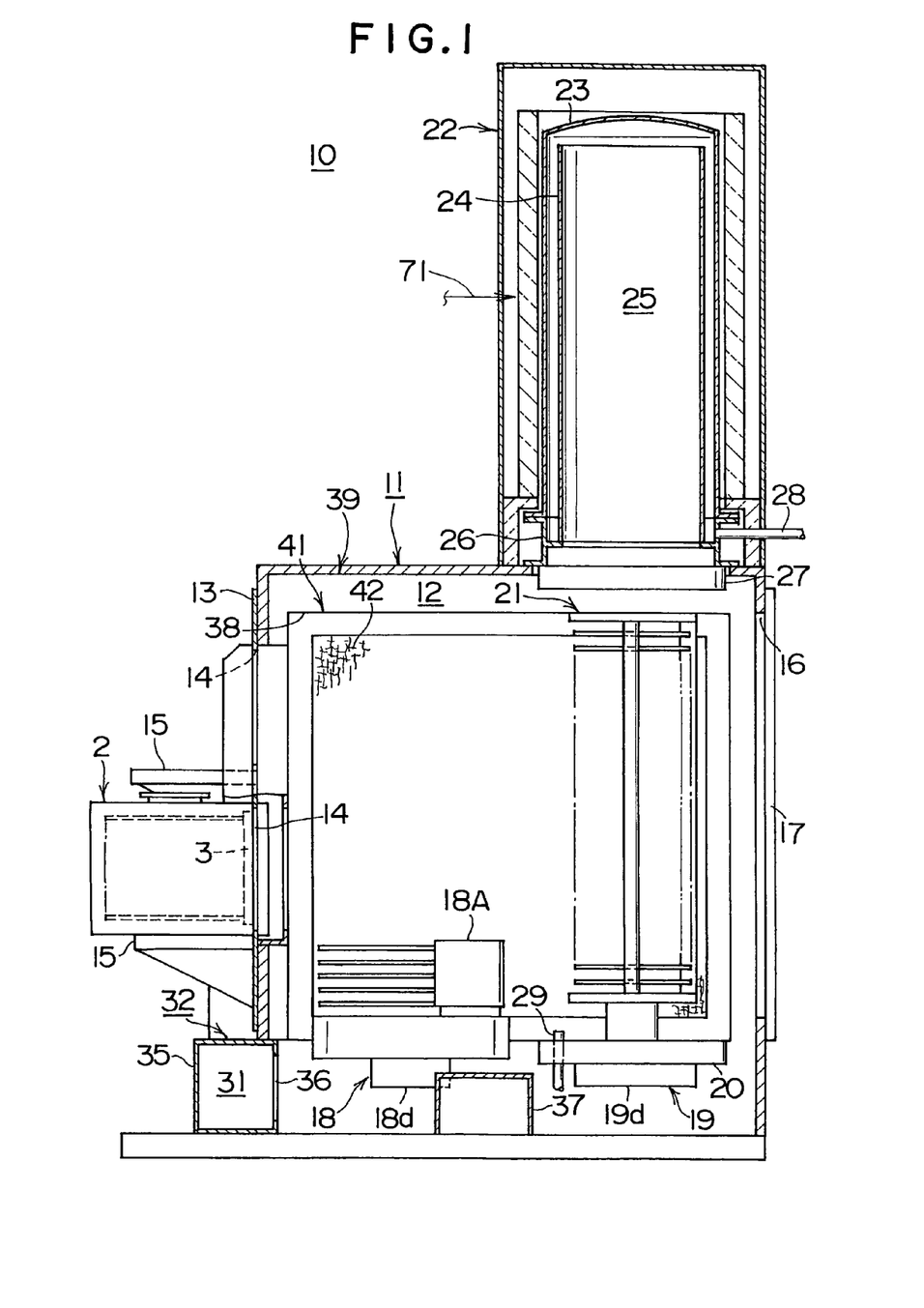
FIG. 1 is a side cross sectional view showing the heat treatment apparatus of an embodiment of the present invention.

As shown in FIG. 1 through FIG. 3, in the wafer loading step, the pod opener 15 opens the pod 2 transferred to the mounting stand the of the pod opener 15, by removing the cap 3 (See FIG. 1).

When the pod opener 15 opens the pod 2, the wafer transfer equipment 18A transfers and charges the multiple wafers 1 stored in the pod 2, to the boat 21.

When the multiple pre-specified wafers 1 are charged, the boat elevator 19 raises the boat 21, to load the boat 21 into the processing chamber 25.

When the boat 21 reaches the upper limit, the processing chamber 25 is sealed air-tight since the edges of the upper surface of the seal cap 20 holding the boat 21 directly contact the lower side of the manifold 26 in a sealed state.

The exhaust pipe 28 exhausts the processing chamber 25 shut in a sealed state, to a specified vacuum intensity, and the heater unit 22 heats the processing chamber 25 to a specified temperature.

The gas supply pipe 29 next supplies the specified process gas to the processing chamber 25.

The wafers 1 are in this way subjected to the specified heat treatment (heat treatment step).

The standby chamber 12 and the circulating path 31 are given a nitrogen gas 30 atmosphere prior to the wafer loading step. The majority of this nitrogen gas 30 is circulated in the standby chamber 12 via the circulating path 31 during the wafer loading step and the heat treatment.

In other words, as shown in FIG. 2, most of the nitrogen gas 30 supplied from the nitrogen gas supply pipe 46 to the circulating path 31, for example approximately 80 percent of that nitrogen gas 30 supplied to the circulating path 31 from the nitrogen gas supply pipe 46 is blown into the standby chamber 12 from the cleaning unit 41 installed in the blow duct 39 in the circulating duct 32, and flows through the standby chamber 12 as a portion of the circulating path 31, and is suctioned into the intake duct 34 from the intake port 33.

The nitrogen gas 30 suctioned into the intake duct 34, returns via the main connecting duct 35 and the sub connecting duct 37 to the blow duct 39, and is again blown into the standby chamber 12 from the cleaning unit 41.

The nitrogen gas 30 circulates through the standby chamber 12 and the circulating path 31 by repeating the flow described above.

On the other hand, a small amount of the nitrogen gas 30 (for example, approximately 15 percent of the nitrogen gas 30 supplied to the circulating path 31 from the nitrogen gas supply pipe 46) that flowed from the standby chamber 12 and the intake duct 34 into the motor mount chamber 54 via the connecting port 56, flows via the exhaust port 58 and the exhaust duct 50 and is exhausted through the bypass 53.

A tiny amount of the nitrogen gas 30 (for example, approximately 5 percent of the nitrogen gas 30 supplied to the circulating path 31 from the nitrogen gas supply pipe 46) is exhausted to outside the case 11 from gaps such as at the case 11 or at the contact surface of the maintenance door 17 and the case 11, or the contact surface between the installation plate 13 and the case 11.

The nitrogen gas supply pipe 46 at this time supplies the nitrogen gas 30 at a flow rate equivalent to the flow rate of the nitrogen gas 30 exhausted from gaps such as at the bypass 53 and the case 11, etc.

The damper 52 on the main exhaust path 51 and the damper 45 for the fresh air supply pipe 44 are closed during this step of circulating the nitrogen gas 30. The damper 47 for the nitrogen gas supply pipe 46 and the damper 57 for the circulating path 31 are open during this circulating step.

When the preset processing time has elapsed, the boat elevator 19 lowers the boat 21, and the boat 21 holding the processed wafers 1 is unloaded to the original standby position in the standby chamber 12.

The shutter 27 seals the processing chamber 25 when the boat 21 is unloaded from the processing chamber 25.

The damper 52 opens during unloading of the boat 21 holding the processed wafers 1. Most of the nitrogen gas 30 in the standby chamber 12 and the circulating path 31, or for example approximately 95 percent of the nitrogen gas supplied from the nitrogen gas supply pipe 46 to the circulating path 31, flows via the connecting port 56 into the motor mount chamber 54. The nitrogen gas 30 flowing into the motor mount chamber 54 is exhausted via the exhaust port 58 and the exhaust duct 50 from the main exhaust path 51 and the bypass 53.

A tiny amount of the nitrogen gas 30 (for example, approximately 5 percent of the nitrogen gas 30 supplied to the circulating path 31 from the nitrogen gas supply pipe 46) is also exhausted to outside the case 11 from gaps such as at the case 11 or at the contact surface of the maintenance door 17 and the case 11, or the contact surface between the installation plate 13 and the case 11. The nitrogen gas supply pipe 46 at this time supplies the nitrogen gas 30 at a flow rate equivalent to the flow rate of the nitrogen gas 30 exhausted from gaps such as at the maintenance exhaust path 51 and the bypass 53 and the case 11, etc.

In other words, the nitrogen gas 30 supplied to the circulating path 31 by the nitrogen gas supply pipe 46 is blown into the standby chamber 12 from the cleaning unit 41 installed in the blow duct 39, and flows through the standby chamber 12, and through the intake port 33 of the intake duct 34 and via the connecting port 56 into the motor mount chamber 54. The nitrogen gas 30 is then exhausted via the exhaust port 58 and the exhaust duct 50, through gaps such as at the main exhaust path 51 and the bypass 53 and the case 11, etc.

During passage through the standby chamber 12, the wafer 1 group that reached a high temperature by the heat treatment and the boat 21 holding these wafers 1 are cooled by heat exchange due to contact with the nitrogen gas 30.

The fresh and cold nitrogen gas 30 supplied directly from the nitrogen gas supply pipe 46 can cool the wafer 1 group and the boat 21 with a high heat exchange efficiency.

Most of the nitrogen gas 30 that cooled the wafer 1 group and the boat 21 undergoes a rise in temperature, flows via the connecting port 56 into the motor mount chamber 54, and then is promptly exhausted via the exhaust port 58 and the exhaust duct 50, from the circulating path 31 by the main exhaust path 51 and the bypass 53. The nitrogen gas 30 that underwent a temperature rise therefore does not pass through the cleaning unit 41 installed on the circulating path 31. Therefore, the nitrogen gas 30 that underwent a temperature rise does not cause a rise in temperature in the cleaning unit 41.

Accordingly, the cleaning unit 41 generates no organic contaminant matter.

Further, the nitrogen gas 30 is the inert gas making contact with the wafers 1 that reached a high temperature so that no natural oxidation film is formed on the surface of the wafers 1.

The damper 52 on the main exhaust path 51 and the damper 47 for the nitrogen gas supply pipe 46 are open during this boat unloading step. The damper 45 for the fresh air supply pipe 44 as well as the damper 57 for the circulating path 31 are closed during this step.

A portion of the nitrogen gas 30 whose temperature has risen may be circulated in the circulating path 31, with a temperature range where the rise in temperature on the circulating path 31 is small.

The wafer transfer equipment 18A picks up the processed wafers 1 on the boat 21 unloaded in the standby chamber 12 and stores them in an empty pod 2. The empty pod 2 is transferred beforehand to the wafer loading port 14, where the cap 3 is removed.

When the pod 2 is filled with the processed wafers 1, the pod opener 15 then fits the cap 3 on the pod 2 to seal it. The pod 2 is then transferred from the wafer loading port 14 to another location.

The wafers 1 are in this way batch processed by the heat treatment apparatus 10 by repeating the above described operation.

However, the flow rate of the nitrogen gas 30 supplied to the standby chamber 12 is a fixed rate. When the exhaust flow rate of the nitrogen gas 30 exhausted from the standby chamber 12, is the same as the exhaust flow rate of the nitrogen gas 30 supplied to the standby chamber 12, then a pressure drop occurs within the standby chamber 12 when the atmosphere (nitrogen gas) leaks from the standby chamber 12.

When the pressure in the standby 12 has dropped, the atmosphere (air) outside the standby chamber 12 can easily flow into the standby chamber 12 so that the oxygen concentration inside the standby chamber 12 rises. Controlling this oxygen concentration then becomes difficult.

The present embodiment, however, prevents this pressure drop in the standby chamber 12 as described next.

In the wafer loading step and the step of circulating nitrogen gas by way of the circulating path 31 during heat processing, the same quantity of the nitrogen gas 30 as exhausted from gaps such as at the bypass 53 and the case 11, etc. is supplied from the nitrogen gas supply pipe 46. During the exhausting of the nitrogen gas 30 by way of the exhaust path 49, the damper 52 closes the main exhaust path 51, and the nitrogen gas 30 is exhausted by way of the bypass 53.

The present embodiment is capable of maintaining a fixed oxygen concentration by preventing pressure drops within the standby chamber 12 to prevent the atmosphere outside the standby chamber 12 from flowing into the standby chamber 12.

Nitrogen gas is also prevented from accumulating and stagnating within the standby chamber 12 by exhausting it via the bypass 53, even in the step of circulating nitrogen gas by way of the circulating path 31 in the heat treatment and the wafer loading step. Therefore besides preventing a natural oxidation film from forming, particles and organic matter are prevented from accumulating within the standby chamber 12.

However, when there is no need to prevent forming of a natural oxidation film, then making a non-circulating one way flow of the clean air 40 in the standby chamber is preferable in terms of thermal effects.

In this case, blowing the clean air 40 from the cleaning unit 41 horizontally to the boat 21 is preferable for preventing the phenomena of particles and organic matter from stagnating and accumulating within the standby chamber 12.

Large quantities of the clean air 40 must be made to flow in the standby chamber 12 in order to form a one-way flow of the clean air 40 that does not cause stagnation and accumulation to occur within the standby chamber 12.

Figure 5:
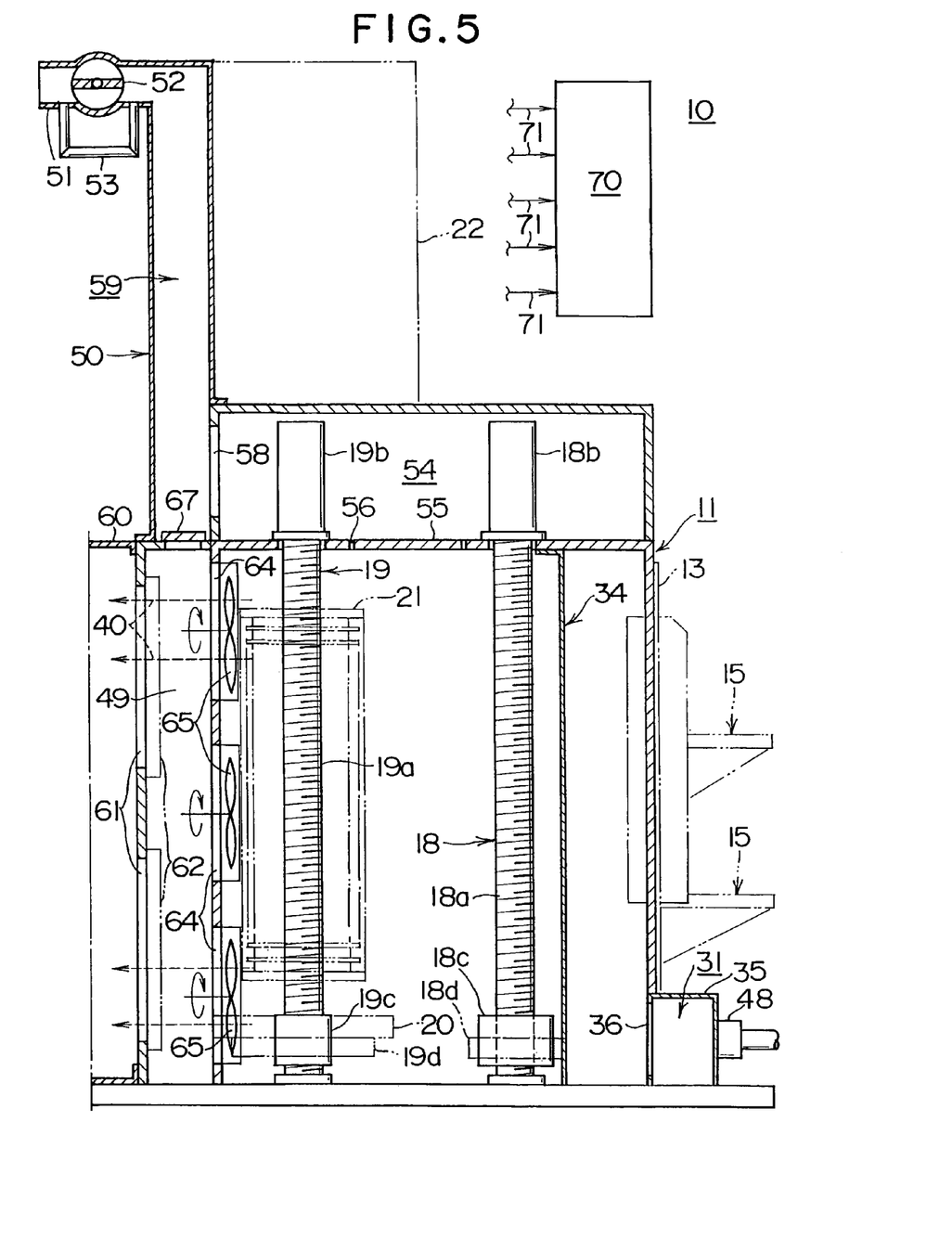
FIG. 5 is a side cross sectional view equivalent to FIG. 4 showing the step of forming a one-way flow of clean air within the standby chamber.

In the heat treatment apparatus 10 of the present embodiment, to make a large quantity of air flow, the controller 70 as shown in FIG. 5, operates the exhaust fan 65 and also operates the gate valve 62 to open the exhaust port 61.

The damper 45 opens and the fresh air (See FIG. 2) supplied from the fresh air supply pipe 44 to the exhaust duct 39 is purified by passing through the cleaning unit 41, is blown horizontally into the standby chamber 12 as the clean air 40, flows horizontally in one direction in the standby chamber 12, passes through the intake port 33 of the intake duct 34, and is suctioned into the intake duct 34.

As shown in FIG. 5, the clean air 40 suctioned into the intake duct 34 is forcibly exhausted horizontally via the multiple exhaust ports 64 to the exhaust path 49 from the exhaust force of the multiple exhaust fans 65. The clean air 40 exhausted in the exhaust path 49, is exhausted into the utility box 60 from the multiple exhaust ports 61.

This one-way flow of the clean air 40 within the standby chamber 12 is sufficiently boosted by the exhaust force of the multiple exhaust fans 65, and therefore forms a large flow that is also a laminar flow so that the wafer 1 group on the boat 21 is effectively cooled.

Moreover, the clean air 40 can be exhausted uniformly in the vertical direction by installing the multiple exhaust fans 65 and the exhaust ports 64 and the exhaust ports 61 arrayed in the vertical direction so that the one-way horizontal flow of the clean air 40 within the standby chamber 12 can be formed uniformly in the vertical direction. Therefore, the wafer 1 group on the boat 21 can be cooled uniformly in the vertical direction.

The clean air flow speed drops since it is temporarily exhausted in the utility box 60. Therefore, no turbulence occurs in the clean room atmosphere around the heat treatment apparatus 10, and particles are not caught up in the atmosphere. Also, even if the utility box 60 is poorly sealed, and a large gas leak occurs in the clean room, the atmosphere is the clean air 40 so that there are no adverse physical effects such as suffocation.

Unlike the case where the interior of the standby chamber 12 is filled with the nitrogen gas 30, when the clean air 40 flows horizontally one-way into the standby chamber 12, the clean air 40 is exhausted horizontally from the exhaust port 61 of the utility box 60 and the exhaust port 64 of the exhaust fan 65, so that the heat can easily be swiftly taken from the wafer 1 group on the boat 21. However, the excess positive pressure at this time causes the temperature to easily rise within the standby chamber 12 so that removing heat from the wafers 1 becomes difficult and the wafers 1 might become oxidized.

In this embodiment, excessive positive pressure within the standby chamber 12 can be prevented by using the exhaust fan 65 to forcibly exhaust the clean air 40 so that these type of harmful effects are prevented.

Heat is prevented from building up in the motor mount chamber 54 since the first gas exhaust path 59 is provided in the motor mount chamber 54 above the intake duct 34.

The present invention therefore renders the following effects.

(1) The forming of a natural oxidation film can be reliably prevented even if wafers prone to easily oxidize are placed within the standby chamber since nitrogen gas can be circulated within the standby chamber by supplying nitrogen gas to the standby chamber from the cleaning unit, and exhausting the nitrogen gas within the standby chamber from the intake duct, and exhausting the nitrogen gas within the intake duct from the first gas exhaust path connected to the upper side of the intake duct.

(2) Stagnation and accumulation within the standby chamber can be prevented by supplying clean air from the cleaning unit into the standby chamber, and exhausting the clean air within the standby chamber from the intake duct, and opening the exhaust port for the exhaust path connected on the side of the intake duct, and then exhausting the clean air within the intake duct via the exhaust path so that a horizontal one-way flow of the clean air can be formed in a laminar flow within the standby chamber.

(3) The equipment running costs can be lowered due to the effect in the above (2) since use of inert gas such as nitrogen gas can be restricted or eliminated in cases where a natural oxidation film is allowable to a certain thickness to an extent that does not cause damage in heat treatment.

(4) Both circulation of nitrogen gas and one-way flow of clean air can be achieved in the same heat treatment apparatus according to the effects in the above (1) and (2).

(5) Increasing the footprint of the heat treatment apparatus can be avoided since the size of the exhaust duct does not need to be enlarged in the above (4).

(6) The wafer group on the boat can be cooled uniformly vertically by installing multiple exhaust fans and exhaust ports vertically so that the clean air can be exhausted uniformly vertically, allowing the horizontal one-way flow of the clean air in the standby chamber to also form uniformly vertically.

(7) Large quantities of clean air can be exhausted from the second gas exhaust path by a gate valve opening the second gas exhaust path since a gate valve to open and close the second gas exhaust path is installed on the second gas exhaust path connected at the side of the gas exhaust unit. Moreover, inert gas can be circulated and exhausted to the first exhaust path by a gate valve that closes the second gas exhaust path. In other words, the first gas exhaust path for exhausting mainly inert gas; and the second gas exhaust path for exhausting mainly gas containing oxygen can be provided independently of each other.

(8) Increasing the footprint of the heat treatment apparatus can be avoided since there is no need to install a new exhaust duct when the utility box is connected to the exhaust path 49.

The present invention is not limited to the above embodiments and needless to say, changes of different types not departing from the spirit or scope of the present invention are allowed.

For example, the exhaust fan 65 and the exhaust port 64 are not limited to three each and 1 or 2 or 4 or more exhaust fans 65 or exhaust ports 64 may be installed.

Moreover, forced gas exhaust units such as the exhaust fans may be omitted.

Figure 6:
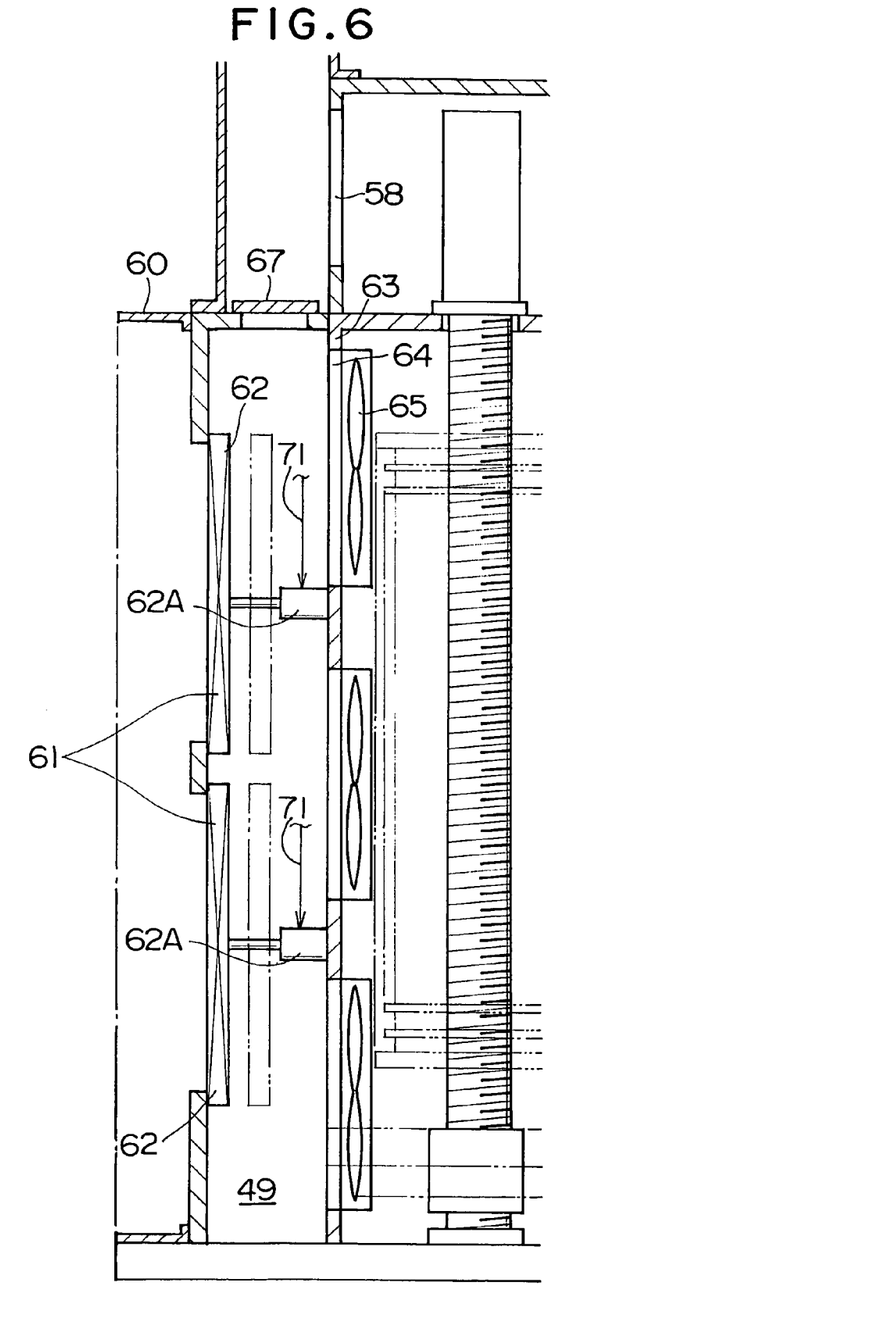
FIG. 6 is a side cross sectional view showing in detail a peripheral section of the exhaust path.

FIG. 6 is a drawing showing in detail the positions of the opening and closing drive unit for the gate valve 62 in the vicinity of the vertical longitudinal exhaust path 49, the gate valve 62 and the exhaust port 61, and the exhaust port 64 and the fan 65.

In FIG. 6, there are a different number of exhaust ports 61 and gate valves 62 (three); and exhaust ports 64 and fans 65 (two) Moreover, the exhaust ports 61 and gate valves 62, and the exhaust ports 64 and fans 65 installation heights are shifted versus each other; and the exhaust port 61 and gate valve 62, and the exhaust port 64 and fan 65 are each alternately positioned vertically.

Cylinder devices 62A as the opening and closing drive unit for opening and closing the gate valve 62 are installed between the multiple exhaust ports 64. These cylinder devices 62A operate so that the gate valve 62 opens and closes the exhaust port 61 by shifting horizontally while remaining perpendicular to the exhaust port 61. These cylinder devices 62A are connected to the centers of the gate valves 62 so that the propulsive force of the cylinder device 62A is easily and uniformly conveyed across the entire area of the gate valve 62.

The controller 70 regulates the cylinder device 62A via the control cable 71.

Installing the cylinder device 62A between the multiple exhaust ports 64 in this way, allows the gate valve 62 to operate smoothly and also makes installing the cylinder device 62A simple.

Also, using the number of exhaust ports 61 and gate valves 62, that is different from the two exhaust ports 64 and fans 65, and shifting the position heights of the exhaust port 61 and gate valve 62 versus the position heights of the exhaust port 64 and the fan 65 so that they are each alternately installed at mutually different installation heights in the vertical direction, allows easily installing the gate valve 62 in the vertical longitudinal space that forms the exhaust path 49, allowing it to be opened or closed. The clean air exhausted from the exhaust port 64 can therefore be exhausted while as much as possible avoiding from the gate valve 62.

Even if the number of exhaust ports 61 and gate valves 62, and the two exhaust ports 64 and fans 65 are made one each, or are made the same quantity of two or more, then the installation heights of the exhaust ports 64 and fans 65 are shifted versus the exhaust ports 61 and gate valves 62, and the exhaust port 61 and gate valve 62, and the exhaust port 64 and fan 65 are preferably each alternately positioned vertically. In this case, the exhaust efficiency and utilization of space will be somewhat less efficient than the previous structure.

This invention is not limited to a structure where the clean air is exhausted into the utility box.

The utility box 60 was described as being installed only at the side of the exhaust path 49. However, this invention is not limited to this position and for example the upper end of the utility box 60 may be shifted to the side of the exhaust duct 50, and the utility box 60 set to a higher position.

The filter installed in the cleaning unit may be a type that removes particles and purifies the air. Preferably, a filter that removes particles and a filter that removes organic matter are installed.

The inert gas in this invention is not limited to nitrogen gas.

The method for utilizing the first gas exhaust path 59 and the second gas exhaust path 49 is not limited to the above embodiment and the method can be selected as needed.

For example in heat treatment process where a natural oxidation film formed to a certain thickness is not a problem, then a changeover can be made to exhausting nitrogen gas from the first gas exhaust path 59, as the nitrogen gas circulating step during the heat treatment step and wafer charging step (wafer loading step) where forced cooling of the wafer group is not required; and exhausting from the second gas exhaust path 49 utilizing the clean air 40 in the boat unloading step.

Moreover, a clean air flow can be used in addition to the nitrogen gas flow in the boat unloading step where forced cooling of the wafer group is needed.

Also, a flow rate of the nitrogen gas 30 equal to the flow rate of the nitrogen gas exhausted from gaps such as at the bypass 53 and the case 11, etc. may be supplied from the nitrogen gas supply pipe 46 without opening the damper 52 in the boat unloading step where forced cooling of the wafer group is not needed.

The case where using a batch type vertical heat treatment apparatus was described in the above embodiment, however, the present invention is not limited to this and can be applied overall to substrate processing apparatus such as batch type vertical diffusion apparatus.

The first gas exhaust path for exhausting nitrogen gas or clean air within the gas exhaust unit, connects to the upper side of the gas exhaust unit. This first gas exhaust path can give priority to whichever is connected to the upper side when exhausting from the standby chamber or upper side of the gas exhaust unit and contribute to making the heat treatment apparatus compact. This design does not interfere, however, with installing the first gas exhaust path on the lower side of the gas exhaust unit.

Figure 7:
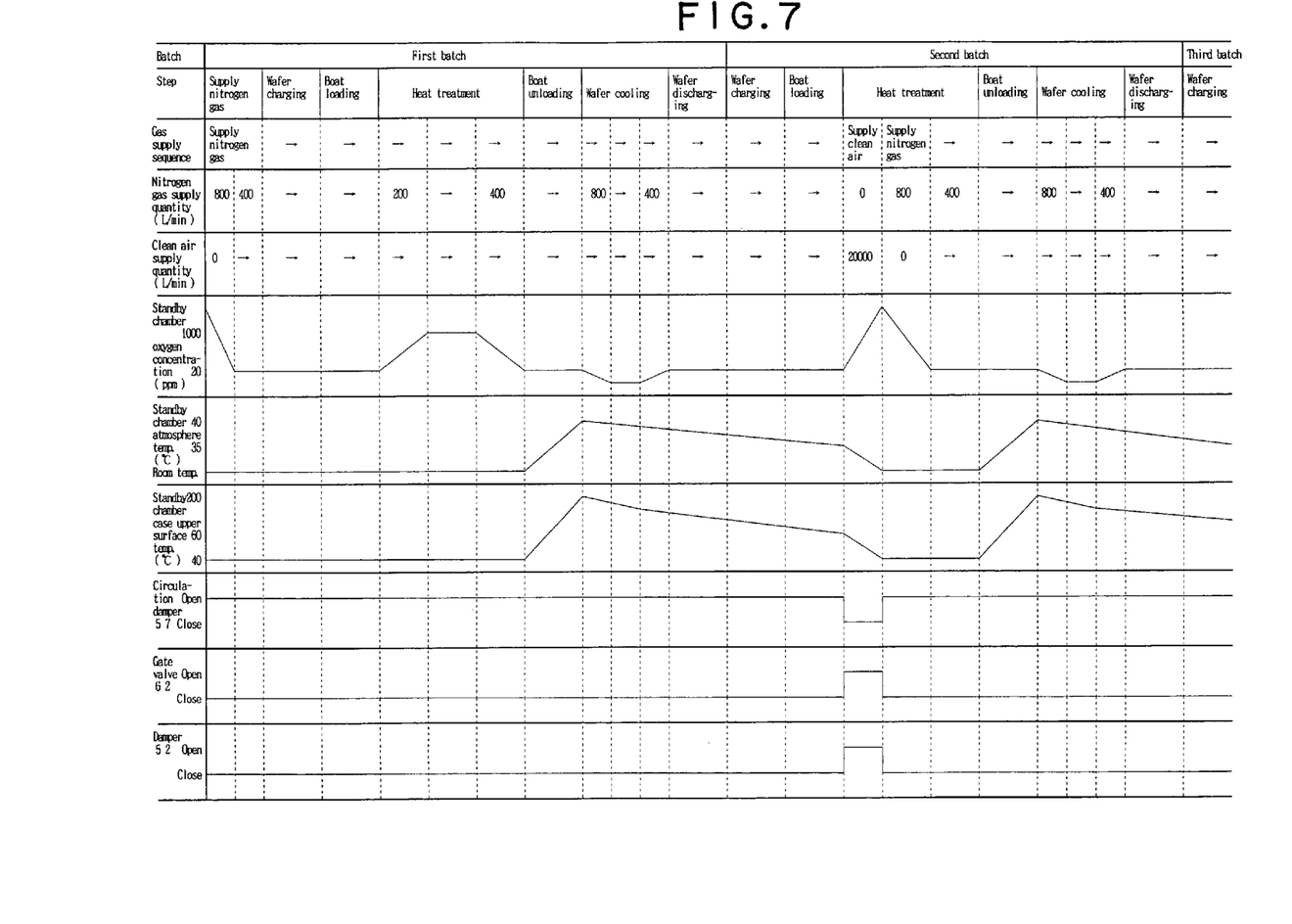
FIG. 7 is a sequence flow chart showing a first variation of the valve usage method.
Figure 8:
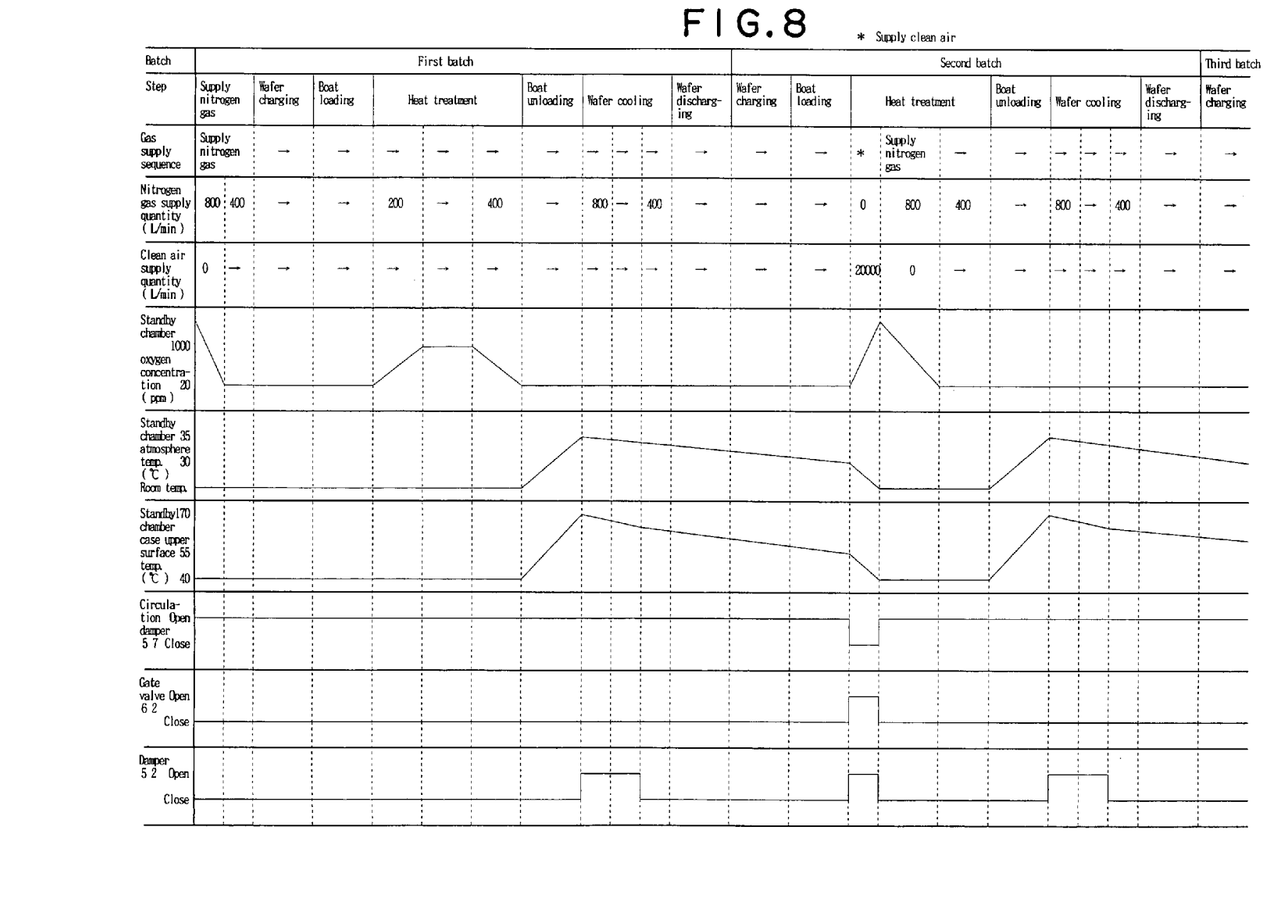
FIG. 8 is a sequence flow chart showing a second variation of the valve usage method.

FIG. 7 and FIG. 8 are sequence flow charts showing adaptations on methods for operating the gas supply sequence into the standby chamber, the nitrogen gas-clean air supply quantity, and the open and close timing for the damper 57, damper 52, and gate valve 62; according to the oxygen concentration within the standby chamber, temperature of the atmosphere within the standby chamber, temperature on the upper side of the case forming the standby chamber, and each step.

In the operating method shown in FIG. 7, in order to accelerate exhaust of heat generated during the previous batch (first batch), during the heat treatment step in the current batch (second batch), the gate valve 62 and the damper 52 are opened, the damper 57 closed, and the clean air 40 is supplied to the standby chamber 12, immediately after the boat loading step of the second batch.

Next, on the way of the heat treatment step, besides closing the gate valve 62, opening the damper 57, and keeping the damper 52 open, nitrogen gas is supplied to the standby chamber 12 at 800 liters per minute, and the oxygen concentration in the interior of the standby chamber 12 is returned to a low concentration state (approximately 20 ppm).

The damper 52 is next closed and the supply of nitrogen gas is continued.

However, after the heat treatment step, when the wafers are carried out from the standby chamber 12 at a high temperature for example of 700° C., the recovered atmosphere reaches 60° C. step prior to passing through the cooler 48, and the atmosphere after passing through the cooler 48 reaches 40° C.

For example, during heat exchange when the temperature of the cooling water flowing in the cooler 48 is set to 20 to 25° C., heat accumulates in the nitrogen gas 30 inside the standby chamber 12 and the case 11 forming the standby chamber 12 in the steps performed on the first batch (first processing) and especially in the boat unloading step of the processed wafers, since heat exchange cannot be performed sufficiently.

The heat accumulates and increases in particular in the nitrogen gas 30 and the inner walls of the standby chamber 12, when repeating a number of batches (performing a process multiple times). This heat accumulation generates organic compounds from the electronic components, elevator and cables installed in the vicinity of the standby chamber 12, and causes thermal deterioration of the filter and generates organic compounds from the seal ring of the filter.

To eliminate these problems, as shown in FIG. 7, the clean air 40 is supplied in quantities larger than the nitrogen gas 30 flow, during the heat treatment step in the second batch and is exhausted by opening the gate valve 62 in the horizontal direction.

The heat can in this way be exhausted without generating stagnation in the standby chamber 12 even if there are large amounts of the clean air 40 and the standby chamber 12 can be quickly cooled.

Unlike the nitrogen gas 30, the clean air 40 can be utilized for example as air in the clean room so that a large flow rate is possible. Moreover, the running costs can be reduced.

The clean air 40 can be preferably efficiently exhausted from the exhaust path 49 serving as the second gas exhaust path by continuously operating the exhaust fan 65.

As shown in FIG. 7, even assuming that the quantity of new nitrogen gas inflow is 800 liters per minute during use of the nitrogen gas 30, the flow rate of the nitrogen 30 in the circulating path 31 is approximately 20,000 liters per minutes and there is a large difference in the relative quantities. The circulating atmosphere in the standby chamber 12 is therefore maintained at approximately 40° C. even if the temperature of the new nitrogen gas is 20 to 25° C. lower than the circulating nitrogen gas temperature of approximately 40° C.

In other words, the temperature only lowers to approximately 35° C. from the boat unloading step for the first batch to the heat treatment step for the second batch. Also, the upper panel of the case 11 forming the standby chamber 12 only lowers to about 60° C.

However, as shown in FIG. 7, by supplying the clean air 40 at a quantity larger (approximately 20,000 liters per minute) than the nitrogen gas 30 during the heat treatment step of the second batch, opening the gate valve 62, and horizontally exhausting the clean air 40, the heat accumulated in the case 11 can be eliminated in a short time, and the atmosphere in the standby chamber 12 can be lowered to room temperature.

Also, the clean air is replaced with nitrogen gas during the heat treatment step so that no natural oxidation film is formed on the wafer.

In the second variation shown in FIG. 8, a method for reducing the thermal diffusion in the wafer cooling step of each batch has been added to the valve operation in the first variation of FIG. 7.

In the wafer cooling step as shown in FIG. 8, the controller 70 increases the nitrogen gas 30 supply flow rate from 400 liters per minute to 800 liters per minute and also opens the damper 52.

By this type of control, the particles and heat generated during the boat unloading step can be exhausted from the first gas exhaust path 59 prior to the cooling step from operating the valve in the first variation. The heat that accumulated in the case 11 in the heat treatment step for the second batch, can therefore be eliminated in an even shorter time, and the atmosphere in the standby chamber 12 can be lowered to room temperature.

Also, cooling the standby chamber by supplying large quantities of clean air in the heat treatment step for the second batch was described in the first variation and the second variation. However, this invention is not limited to this method and for example, the standby chamber may be cooled by supplying large quantities of clean air in the same way during the heat treatment step even for the third batch onwards. Preferably, the cooling is performed every other batch for good efficiency.

Preferred aspects are described next.

(1) A substrate processing apparatus comprising:
a processing chamber for processing a substrate;
a substrate supporting tool for supporting and carrying the substrate into the processing chamber;
a standby chamber formed below the processing chamber for holding the substrate supporting tool in standby;
a gas supply unit provided on the side of the standby chamber for supplying inert gas or gas containing oxygen into the standby chamber;
a gas exhaust unit provided on the side of the standby chamber and opposite to the gas supply unit, for exhausting the inert gas or gas containing oxygen from the standby chamber;
a first gas exhaust path connected to the gas exhaust unit for exhausting the inert gas or gas containing oxygen within the gas exhaust unit;
a second gas exhaust path connected to the side of the gas exhaust unit for exhausting the gas containing oxygen within the exhaust gas unit; and
a gate valve for opening and closing the second gas exhaust path.

(2) A substrate processing apparatus according to the first aspect (1), comprising multiple forced gas exhaust units for exhausting the gas to the second gas exhaust path; and an opening and closing drive unit installed among the multiple forced gas exhaust units for opening and closing the gate valve.

(3) A substrate processing apparatus according to the first aspect (1), comprising a gas supply path formed upstream of the gas supply unit for supplying the inert gas or gas containing oxygen.

(4) A substrate processing apparatus according to the first aspect (1), comprising a controller for regulating the gate valve, wherein the controller controls the closing of the second gas exhaust path by operating the gate valve during supply of the inert gas from the first gas supply path to the standby chamber; and the opening of the second gas exhaust path by operating the gate valve during supply of the gas containing oxygen from the second gas supply path to the standby chamber.

(5) A substrate processing apparatus according to the fourth aspect (4), wherein the controller regulates the quantity of gas so that the quantity of the gas containing oxygen supplied from the second gas supply path to the standby chamber becomes larger than the quantity of the inert gas supplied from the first gas supply path to the standby chamber.

(6) A substrate processing apparatus according to the first aspect (1), wherein multiple exhaust ports are provided on the second gas exhaust path in the vertical direction, and the multiple gate valves are installed in the vertical direction to open and close the multiple exhaust ports.

(7) A substrate processing apparatus according to the sixth aspect (6), wherein the multiple forced gas exhaust units and the gate valves are each alternately positioned vertically.

(8) A substrate processing apparatus according to the second aspect (2), comprising a controller for regulating the gate valve and the forced gas exhaust unit, wherein the controller controls the closing of the second gas exhaust path by operating the gate valve during supply of the inert gas from the first gas supply path to the standby chamber; and along with the operating of the forced gas exhaust unit, also the opening of the second gas exhaust path by operating the gate valve, during the supply of the gas containing oxygen from the second gas supply path to the standby chamber.

(9) A substrate processing apparatus according to the first aspect (1), wherein the first gas exhaust path connects to the upper side of the exhaust gas unit.

(10) A substrate processing apparatus comprising:
a processing chamber for processing a substrate;
a substrate supporting tool for supporting and carrying the substrate into the processing chamber;
a standby chamber for holding the substrate supporting tool in standby;
a gas supply unit provided on the side of the standby chamber for supplying at least gas containing oxygen into the standby chamber;
a gas exhaust unit provided on the side of the standby chamber and opposite to the gas supply unit, for exhausting at least the gas containing oxygen from the standby chamber;
a gas exhaust path connected to the side of the gas exhaust unit for exhausting the gas containing oxygen within the gas exhaust unit; and
a gate valve to open and close the gas exhaust path.

(11) A substrate processing apparatus according to the tenth aspect (10), comprising multiple forced exhaust gas units for exhausting the gas to the gas exhaust path, and an opening and closing drive unit installed among the multiple forced gas exhaust units for opening and closing the gate valve.

(12) A semiconductor device manufacturing method using the substrate processing apparatus according to the first aspect (1), comprising at least:
a step of supporting a substrate in the substrate supporting tool and processing the substrate in the processing chamber;
a step of unloading the substrate supporting tool supporting the processed substrate from the processing chamber to the standby chamber;
a step of supplying gas containing oxygen from the gas supply unit to the standby chamber, and opening the gate valve to exhaust the gas containing oxygen within the standby chamber, via the gas exhaust unit, from the second gas exhaust path.

(13) A semiconductor device manufacturing method according to the twelfth aspect (12), wherein the step of exhausting the gas containing oxygen is performed within a fixed period within the step of unloading the substrate.

(14) A semiconductor device manufacturing method using the substrate processing apparatus according to the tenth aspect (10), comprising at least:
a step of supporting a substrate in the substrate supporting tool and processing the substrate in the processing chamber;
a step of unloading the substrate supporting tool supporting the processed substrate from the processing chamber to the standby chamber; and
a step of supplying gas containing oxygen from the gas supply unit to the standby chamber, and opening the gate valve to exhaust the gas containing oxygen within the standby chamber, via the gas exhaust unit, from the second gas exhaust path.

(15) A semiconductor device manufacturing method according to the fourteenth aspect (14), wherein the step of exhausting the gas containing oxygen is performed within a fixed period within the step of unloading the substrate.

(16) A semiconductor device manufacturing method comprising at least:
a step of supporting a substrate in a substrate supporting tool and processing the substrate in a processing chamber;
a step of unloading the substrate supporting tool supporting the processed substrate from the processing chamber to the standby chamber; and
a step of supplying gas containing oxygen from a gas supply unit provided on the side of the standby chamber to the standby chamber, and exhausting the gas containing oxygen within the standby chamber, via a gas exhaust unit provided on the side of the standby chamber and opposite to the gas supply unit, from a gas exhaust path opened by a gate valve and connected on the side of the gas exhaust unit within at least a fixed period within the step of unloading the substrate supporting tool.

(17) A semiconductor device manufacturing method comprising:
a step of supplying inert gas or gas containing oxygen from a gas supply unit provided on the side of a standby chamber to the standby chamber;
a step of holding a substrate supporting tool for supporting a substrate in the standby chamber in standby before loading into a processing chamber;
a step of exhausting the inert gas or gas containing oxygen within the standby chamber from a gas exhaust unit provided on the side of the standby chamber and opposite to the gas supply unit, in at least a fixed period within the standby step;
a step of exhausting the inert gas or gas containing oxygen within the gas exhaust unit from a first gas exhaust path connected to the gas exhaust unit;
a step of exhausting the gas containing oxygen within the gas exhaust unit, by opening a second gas exhaust path connected to the side of the gas exhaust unit by operating a gate valve;
a step of closing the second gas exhaust path by the gate valve;
a step of loading the substrate supporting tool supporting the substrate from the standby chamber to the processing chamber; and
a step of processing the substrate in the processing chamber.

The invention claimed is:
1. A substrate processing apparatus, comprising:
a processing chamber for processing a substrate;
a substrate supporting tool for supporting and carrying the substrate into the processing chamber;
a wafer transfer equipment for carrying the substrate to the substrate supporting tool;
a standby chamber formed below the processing chamber for holding the wafer transfer equipment and the substrate supporting tool in standby;
a gas supply unit provided on the side of the standby chamber for supplying inert gas or gas containing oxygen into the standby chamber;
a circulating path for circulating inert gas supplied from the gas supply unit to the standby chamber;
an intake duct having an intake port, provided on the side of the standby chamber and opposite to the gas supply unit, for exhausting the inert gas or gas containing oxygen from the standby chamber;
a first gas exhaust path for exhausting, from the substrate processing apparatus, the inert gas or gas containing oxygen within the intake duct;
a second gas exhaust path, separate from the first gas exhaust path, being openable and closable, connected to the side of the intake duct for exhausting from the substrate processing apparatus;
wherein the first exhaust path is connected to an upper side of the second gas exhaust path,
a forced gas exhaust unit connected to the intake duct for exhausting the gas to the second gas exhaust path; and at least one gate valve disposed downstream of the forced gas exhaust unit for opening and closing the second gas exhaust path,
wherein the intake duct isolates respective elevator shafts of the substrate supporting tool and the wafer transfer equipment from the standby chamber.

2. A substrate processing apparatus according to claim 1, comprising an exhaust port, being openable and closable, arranged downstream of the gate valve.

3. A substrate processing apparatus according to claim 2, comprising a utility box connected to the exhaust port, wherein gas pipes are installed.

4. A substrate processing apparatus according to claim 1, wherein the flow path area of the second gas exhaust path is larger than the flow path area of the first gas exhaust path.

5. A substrate processing apparatus according to claim 1, comprising a partition plate that isolates the first gas exhaust path from the second gas exhaust path.

6. A substrate processing apparatus according to claim 1, comprising a controller for regulating the gate valve, wherein the controller controls the gate valve along with operating the forced gas exhaust unit, when supplying the gas containing oxygen.

7. A substrate processing apparatus according to claim 1, wherein the circulating path having a main connecting duct installed at the front end of the standby chamber and another connecting duct installed between the gas supply unit and the intake duct.

8. A substrate processing apparatus according to claim 1, wherein the gas supply unit having a first gas supply path for supplying the inert gas into the standby chamber and a second gas supply path for supplying the gas containing oxygen into the standby chamber.

9. A substrate processing apparatus according to claim 8, comprising a controller for regulating the gate valve, wherein the controller controls the closing of the second gas exhaust path by operating the gate valve during supply of the inert gas from the first gas supply path to the standby chamber; and
the opening of the second gas exhaust path by operating the gate valve during supply of the gas containing oxygen from the second gas supply path to the standby chamber.

* * * * *